(12) United States Patent
Nurmi

(10) Patent No.: US 6,714,423 B1
(45) Date of Patent: Mar. 30, 2004

(54) PROTECTING DEVICE AGAINST ELECTROMAGNETIC RADIATION COMPRISING EMI-GASKETS

(75) Inventor: Reijo Nurmi, Oulu (FI)

(73) Assignee: Nokia Corporation, Espoo (FI)

( * ) Notice: Subject to any disclaimer, the term of this patent is extended or adjusted under 35 U.S.C. 154(b) by 117 days.

(21) Appl. No.: 10/018,172

(22) PCT Filed: Jun. 22, 2000

(86) PCT No.: PCT/FI00/00571

§ 371 (c)(1),
(2), (4) Date: Feb. 4, 2002

(87) PCT Pub. No.: WO01/01746

PCT Pub. Date: Jan. 4, 2001

(30) Foreign Application Priority Data

Jun. 24, 1999 (FI) .................................................. 991455

(51) Int. Cl.⁷ .......................... H05K 9/00; H05K 7/14; H05K 7/18
(52) U.S. Cl. ...................... 361/818; 361/816; 361/800; 174/35 R; 174/35 GC; 439/927; 277/920
(58) Field of Search ................................ 361/816, 818, 361/820, 799, 753, 728, 732, 740, 747, 759, 801, 802; 174/35 R, 35 GC, 35 MS; 312/223.1, 223.2; 211/41.17, 26.2; 428/148; 277/939, 920; 439/86, 92, 89, 95, 96, 101, 108, 609, 927

(56) References Cited

U.S. PATENT DOCUMENTS

| | | |
|---|---|---|
| 3,011,775 A | 12/1961 | MacLeod |
| 3,502,784 A | 3/1970 | Kunkel |
| 3,904,810 A | 9/1975 | Kraus |
| 4,529,257 A | 7/1985 | Goodman et al. |
| 4,564,722 A | 1/1986 | Nordin |
| 4,572,921 A | 2/1986 | May et al. ..................... 174/35 |
| 4,780,570 A | 10/1988 | Chuck |
| 4,788,381 A | 11/1988 | Nilsson |
| 4,929,802 A | 5/1990 | Schaepers et al. |
| 5,029,254 A | 7/1991 | Stickney ....................... 174/35 |
| 5,091,606 A | 2/1992 | Balsells ........................ 174/35 |
| 5,134,244 A | 7/1992 | Balsells |
| 5,223,670 A | 6/1993 | Hogan et al. |
| 5,313,016 A | 5/1994 | Brusati et al. |
| 5,474,309 A | 12/1995 | Balsells |
| 5,502,784 A | 3/1996 | Rondeau |
| 5,545,843 A | 8/1996 | Arvidsson et al. |
| 5,581,048 A | 12/1996 | Shores |
| 5,603,514 A | 2/1997 | Jencks et al. |
| 5,770,822 A | 6/1998 | Abolitz et al. ................ 174/35 |
| 5,885,118 A | 3/1999 | Billenstein et al. |
| 6,182,835 B1 * | 2/2001 | Chen .......................... 211/13.1 |

FOREIGN PATENT DOCUMENTS

| | | |
|---|---|---|
| CH | 668 527 | 10/1985 |
| DE | 1849258 | 4/1962 |

(List continued on next page.)

*Primary Examiner*—Phuong T. Vu
(74) *Attorney, Agent, or Firm*—Cohen, Pontani, Lieberman & Pavane

(57) ABSTRACT

The object of the invention is a device and an elongated EMI gasket (20) made for an electroconductive wire, used for its EMI shiekding (electromagnetic interference). The EMI gasket (20) comprises, on a first plane, a bending portion (23a, 23b) that forms a first flat part (23) for attaching the EMI gasket (20) to a device to be EMI shielded so that the EMI gasket touches the device to be EMI shielded with its surface, which is according to said first plane. Typically, the attachment is carried out by pushing the EMI gasket (20) into a groove (26) adapted in connection with the joint to be EMI sealed. EMI tightness is achieved by pressing together parts (21, 22) of the device to be EMI shielded, whereupon the EMI gasket (20) attached in between them forms an electric contact at short distances between said parts.

15 Claims, 7 Drawing Sheets

FOREIGN PATENT DOCUMENTS

| | | |
|---|---|---|
| DE | 197 01 690 | 7/1998 |
| EP | 0477 628 A1 | 9/1991 |
| EP | 0 889 686 | 6/1998 |
| GB | 1 505 579 | 3/1978 |
| GB | 2 222 913 A | 3/1990 |
| JP | 56-158202 | 12/1981 |
| JP | 10-173382 | 6/1998 |
| WO | WO 94/30035 | 12/1994 ............ H05K/9/00 |

* cited by examiner

1

PROTECTING DEVICE AGAINST ELECTROMAGNETIC RADIATION COMPRISING EMI-GASKETS

PRIORITY CLAIM

This is a national stage of PCT application No. PCT/FI00/00571, filed on Jun. 22, 2000. Priority is claimed on that application and on patent application No.: 991455, filed in Finland on Jun. 24, 1999.

FIELD OF THE INVENTION

The present invention relates to protecting devices against interfering electromagnetic radiation.

BACKGROUND OF THE INVENTION

Electromagnetic radiation generated in a device may disturb either the device's own operation or the operation of some external device. Generally, the aim is to protect sensitive devices and interfering sources of electromagnetic radiation against radiation by encasing them in packages made from a conductive material and by sealing the packages so tight that no interfering electromagnetic radiation can penetrate the package. This type of or similar protection of devices against electromagnetic radiation is called EMI (electromagnetic interference) shielding.

One problematic area in EMI shielding is the sealing of junctions and joint surfaces comprised by devices, device cabinets and boxes. If the joint surfaces are not properly sealed with EMI gaskets, interfering electromagnetic radiation will quite easily pass through the joint. The best protection against interference is achieved when the joint surfaces are tightly sealed together galvanically. This means that resistance between the joint surfaces, so-called 'junction resistance', is as low as possible. However, it is difficult and expensive to manufacture such plane-like joint surfaces, where the surfaces are tightly attached to each other in every place galvanically. Therefore, solutions in which a good contact between the joint surfaces is not formed in every place but at certain distances along the whole length of the joint, are used for sealing joint surfaces. When the distance between the contacts formed is sufficiently short, electromagnetic radiation can no longer penetrate the joint in disturbing quantities. A sufficient contact distance depends on the frequency of the interfering radiation and the required attenuation level. Mechanical properties and the available space also affect the contact distance used. In connection with device cabinets and racks, a typical contact distance can be, e.g. 5–15 mm.

EMI sealing is required in various types of electric devices. Among others, EMI gaskets are used in device box and cabinet doors and apertures, as well as in partitions between different units inside device cabinets.

There are at least three types of gaskets that are most commonly used for EMI sealing. In one solution, a mantle is knitted from a conductive material around a resilient rubber compound or some other corresponding material. The mantle is knitted from a very thin wire that acts as a conductive fabric. When placed in between joint surfaces, these types of gaskets give an even contact but do not necessarily give a sufficient contact for EMI shielding due to the large contact area. They do not pierce through the surface, which is slightly oxidised or greasy. These types of gaskets may shed short pieces of wire, which can cause a short circuit after being passed on to a printed board. Neither do they endure friction and continuous wear.

In a second solution conductive particles are mixed inside a rubber-like sealing compound, the conductive particles forming a galvanic connection between joint surfaces when the joint surfaces are pressed together. However, the electroconductivity of these types of gaskets does not come near to that of, e.g. copper alloyed gaskets. Furthermore, the properties of these types of gaskets may change as they age.

A third solution is provided by spring-like gaskets bent from sheet metal. Their electroconductivity is good, but their manufacture is problematic. The manufacture of spring-like sheet metal gaskets requires expensive perforating and bending tools. In addition, the edges of the gaskets are sharp, whereupon one may hurt one's hand on them, and the length of the gaskets is limited to the length of the sheet used in their manufacture, which normally is about 70 cm, in which case a full-length gasket must be assembled from several pieces.

The most significant disadvantage of a spring-like sheet metal gasket is, however, its susceptibility to being damaged due to its poor elastic properties. The gasket has extremely accurate tolerance of compression. If joint surfaces are pressed together too little, the gasket placed in between them will leak, as it is called, i.e. let electromagnetic radiation significantly through it. If again joint surfaces are pressed too much, a permanent deformation will take place in the gasket and its compression force will no longer be sufficient. Also in this case, the joint will begin to leak.

FIG. 1 illustrates an EMI gasket presented in the Patent Publication U.S. Pat. No. 5,091,606, which comprises a helical spring 10 made from a circular profiled wire and may comprise a layer 11 made on top of the spring from a conductive and ductile material. When this type of gasket is placed in between the surfaces to be sealed and the surfaces are pressed against each other, a contact is formed between the surfaces. The gasket is intended for sealing shafts and other surfaces with a circular cross-section, and their circumferences. A disadvantage of these types of gaskets is a reasonably complex manufacturing process, as well as the difficulty of fitting the gasket into small spaces.

Low structures and other objects that do not have much space for the joints of the structure are difficult to EMI shield with gaskets according to prior art, e.g. with helical spring-like EMI gaskets. Furthermore, it is difficult to attach an EMI gasket in narrow places.

SUMMARY OF THE INVENTION

Now, EMI sealing has been invented with the help of which the disadvantages presented above can be mitigated. It is characteristic of an EMI gasket made from an electroconductive wire by bending that the EMI gasket comprises, on a first plane, a bending portion that forms a first flat part for attaching the EMI gasket to a device to be EMI shielded so that the EMI gasket touches the device to be EMI shielded with its surface, which is according to said first plane.

Correspondingly, it is characteristic of a device according to the invention, the device comprising a first part, a second part and in between them an EMI gasket made from an electroconductive wire by bending for getting said first and second parts into contact and for preventing electromagnetic interference from penetrating the joining point between the first and second parts, that the EMI gasket comprises, on a first plane, a bending portion that forms a first flat part for attaching the EMI gasket to said first part of the device so that the EMI gasket touches said first part with its surface, which is according to said first plane, and that the EMI gasket attached to said first part of the device is adapted to form an electric contact between said first and second parts of the device when said first and second parts of the device are pressed together.

In accordance with the invention, the EMI gasket is made from a spring-like electroconductive wire that is bent in the appropriate shape depending on the use, so that the focus when bending the wire is on space saving solutions. According to the invention, the EMI gasket comprises a flat part by which the EMI gasket is easy to attach to its place of use. Typically, the attachment is carried out by pushing the EMI gasket into a groove adapted in connection with the joint to be EMI sealed. EMI tightness is achieved by pressing the joint surfaces together, whereupon the EMI gasket attached in between them comes into electric contact at short distances between the joint surfaces.

Other objects and features of the present invention will become apparent from the following detailed description considered in conjunction with the accompanying drawings. It is to be understood, however, that the drawings are intended solely for purposes of illustration and not as a definition of the limits of the invention, for which reference should be made to the appended claims.

BRIEF DESCRIPTION OF THE DRAWINGS

In the following, the invention will be explained in detail by referring to the enclosed drawings, in which.

DETAILED DESCRIPTION OF THE PRESENTLY PREFERRED EMBODIMENTS

Figure 1:
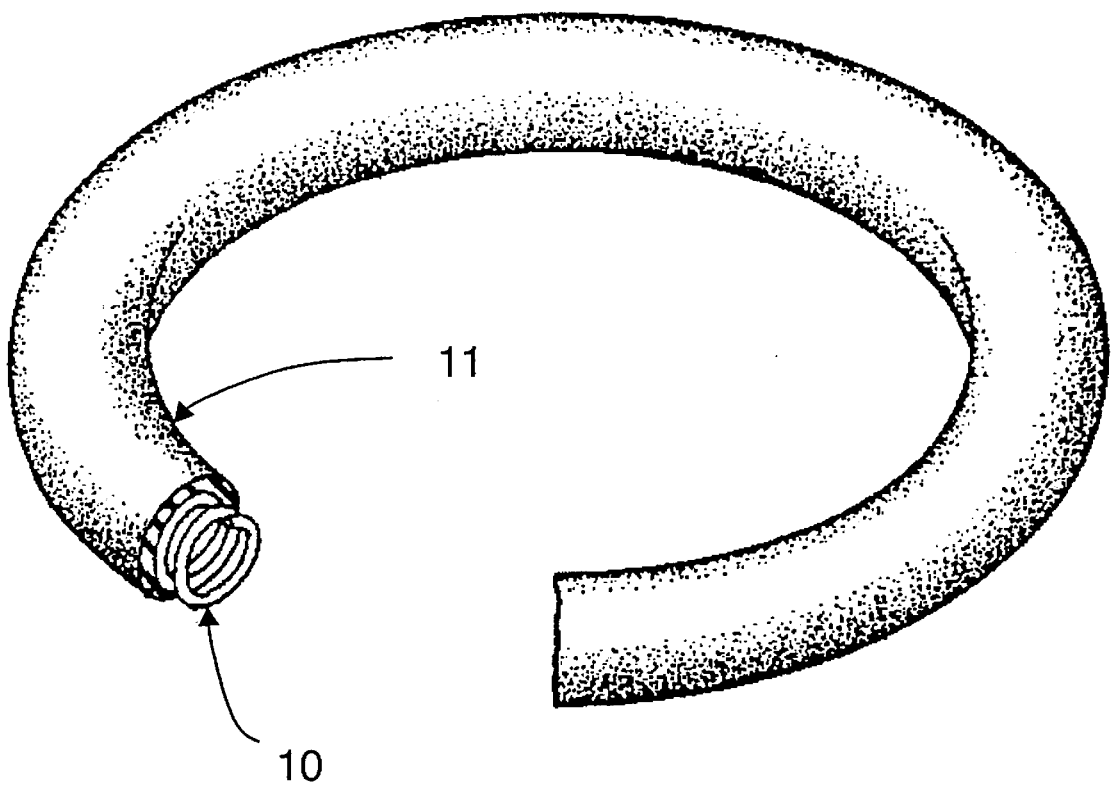
FIG. 1 shows an EMI gasket according to prior art.
Figure 2A:
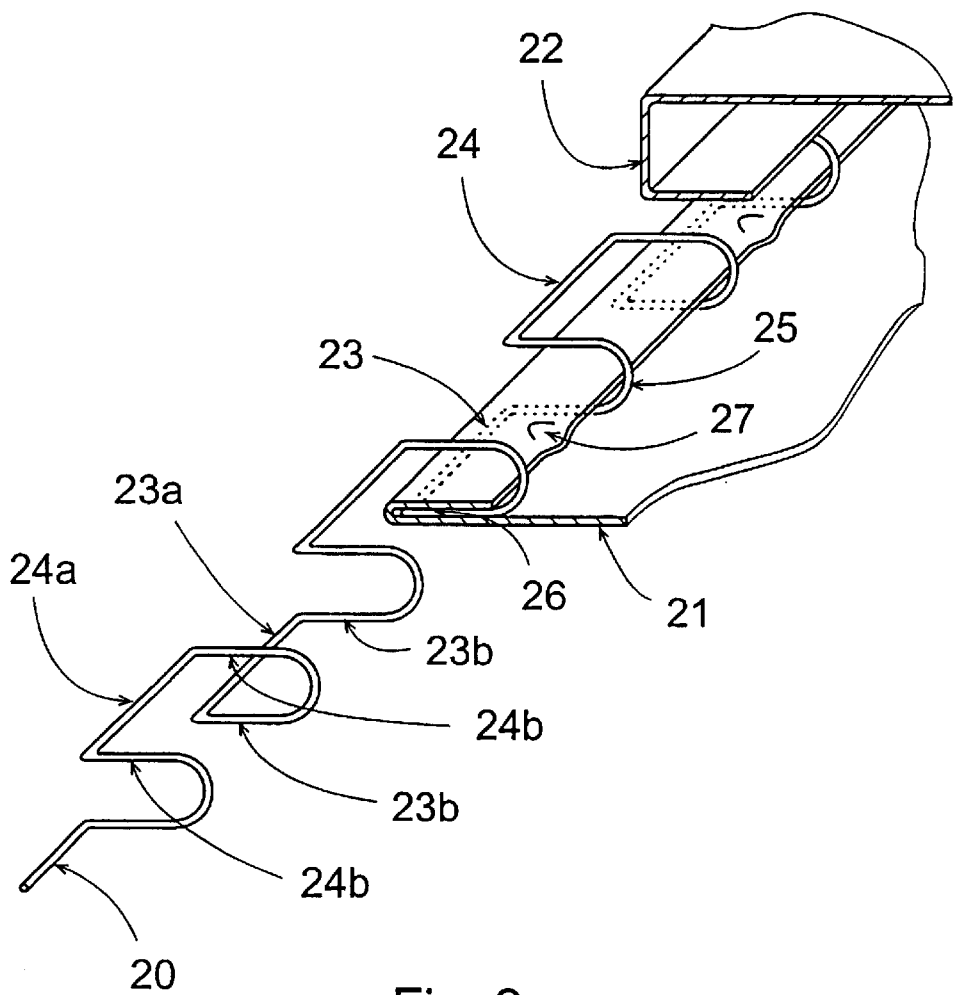
FIGS. 2a–2b show a first embodiment for EMI sealing a device cabinet according to the invention.
Figure 2B:
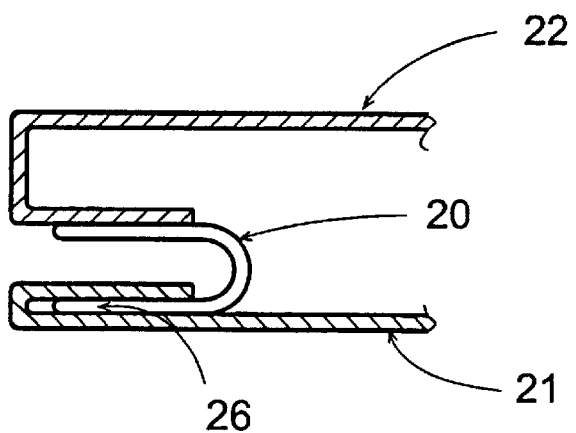

FIG. 1 was described above in connection with the description of prior art. FIGS. 2a and 2b are related to the first embodiment according to the invention, in which a joint of a device cabinet is sealed EMI tight. Here, the term device cabinet is used as a common noun that refers to all types of device boxes, racks and cabinets of different sizes used for protecting devices, the external dimensions of which may typically vary from some tens of millimetres to a few metres.

Typically, a device cabinet (FIG. 2a) to be sealed is made from an electroconductive material, such as sheet metal, and it comprises a first part 21 and a second part 22. An EMI gasket 20 used for sealing is made from an electroconductive wire with a circular cross-section, and it is periodically bent so that it comprises first and second flat parts 23, 24 along a specific length of the gasket. Both flat parts 23, 24 preferably comprise a straight portion 23a, 24a parallel to the longitudinal direction of the EMI gasket 20, as well as two portions 23b, 24b parallel to each other and perpendicular to the longitudinal axis of the gasket. The flat parts 23, 24, which are preferably not located on the same plane, are joined at least partly by a curved portion 25 that belongs to the plane the normal of which is the longitudinal axis of the gasket 20. In this case, the cross direction profile of the EMI gasket 20 is preferably a U profile.

The EMI gasket 20 can be made from several different materials, e.g. from alloyed copper metal, stainless steel or other corresponding material. The gasket's electrical and mechanical properties, as well as manufacturability can be affected by the selection of the sealing material. The diameter of the wire used for the manufacture of the gasket may vary, but is typically approximately 0.3–5 mm. The diameter of the gasket can be, e.g. 2–40 mm. Since the number of electric contacts formed on the joint surfaces along the length of one period is one, at a minimum, the length of a period of a periodic gasket must typically be less than 15 mm so that sufficient EMI tightness can be achieved. A sufficient contact distance is determined by the required attenuation level and the frequency of interfering electromagnetic radiation (wavelength). The sealing wire is bent in the required shape by a spring-making machine designed for bending wire material.

Said first part 21 of the device cabinet is preferably bent so that it comprises a groove 26 into which the EMI gasket 20 is pushed by its said first flat part 23 for attaching the gasket. The groove 26 is substantially on the same plane as the primary surface of said first part 21 of the device cabinet. The attachment of the gasket 20 to the first part 21 of the device cabinet can be improved by striking in the edges of the groove 26 at regular distances, whereupon a depression 27 is formed on the edge of the groove 26 preventing the flat part of the gasket 20 from getting out of the groove.

The joint between the first and second parts 21, 22 of the device cabinet is produced by matching said parts together and by pressing the parts against each other (FIG. 2b). However, the first and second parts 21, 22 of the device cabinet are not in direct contact with each other, but the EMI gasket 20 is in between them. This being the case, a small air gap remains between said parts of the device cabinet.

When the parts 21, 22 of the device cabinet are pressed against each other, a compression is produced on the EMI gasket 20 attached in between them. The elastic forces that act in the compressed gasket 20 tend to return the gasket into its original shape, whereupon the flexible gasket 20 presses by its flat parts 23, 24 tightly against the surfaces of the cabinet's first and second parts that are in contact with it. This means that firm electric contacts are formed between said first and second parts 21, 22 joined together through the EMI gasket 20, at short, regular distances along the whole length of the joint preventing electromagnetic radiation from penetrating the joint.

Figure 3A:
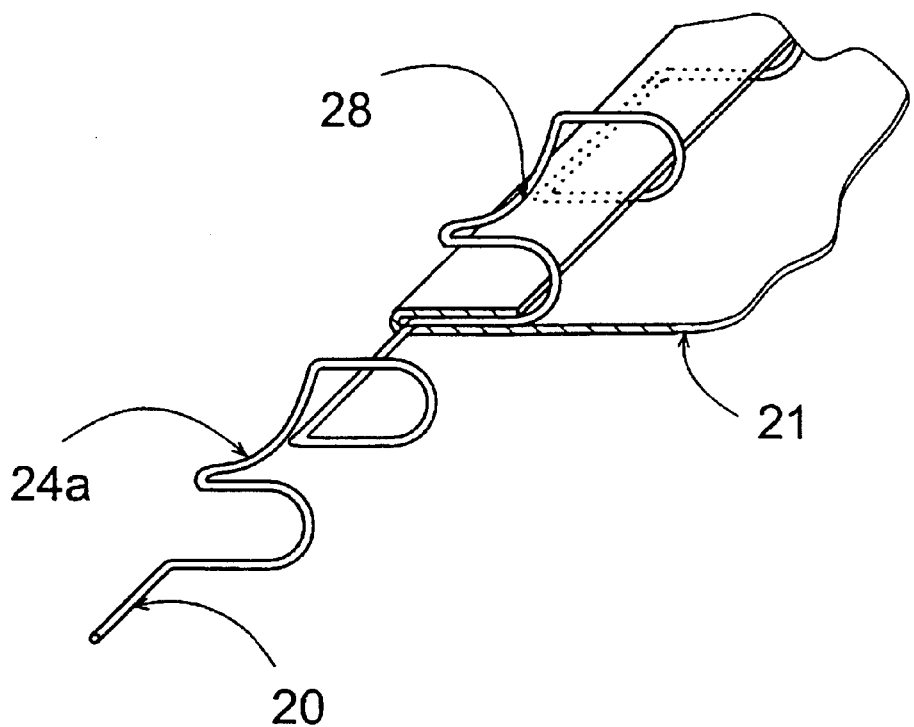
FIGS. 3a–3b show an alternative implementation of the first embodiment according to the invention.
Figure 3B:
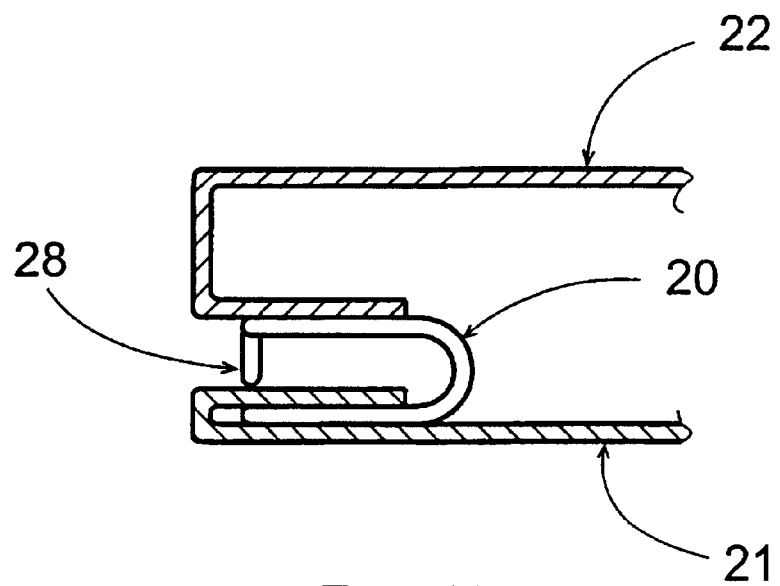

In an alternative implementation of the first embodiment according to the invention (FIGS. 3a and 3b), the longitudinal portion 24a of said second flat part 24 of the EMI gasket 20 is depressed 28 so that the depression 28 of the sealing wire points towards the first part 21 of the device cabinet. When this kind of EMI gasket 20 is installed in its place between surfaces to be sealed (FIG. 3b) and the structure is pressed, the elastic distance of the EMI gasket 20 is linearly dependant on the compression force used until the bottom of the depression 28 touches said first part 21 of the device cabinet. If there is a desire to further increase the elastic distance after this, the compression force must be increased significantly.

Figure 4A:
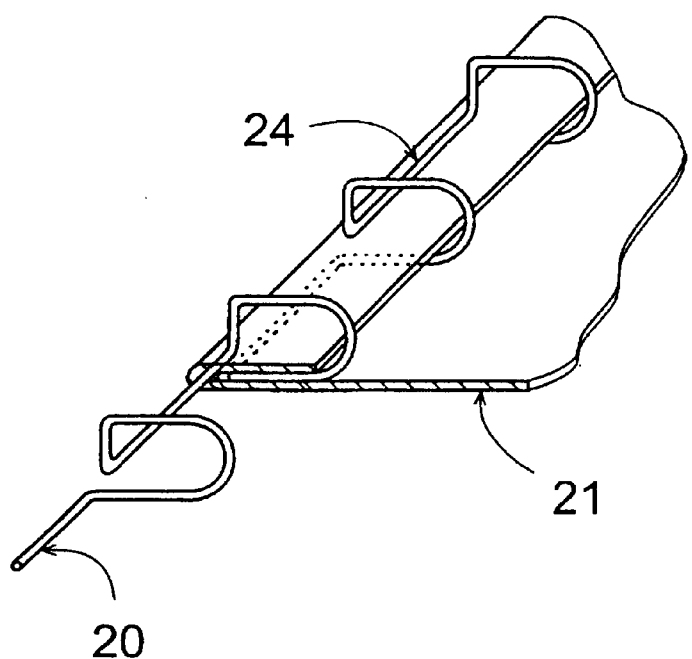
FIGS. 4a–4b show a second alternative implementation of the first embodiment according to the invention.
Figure 4B:
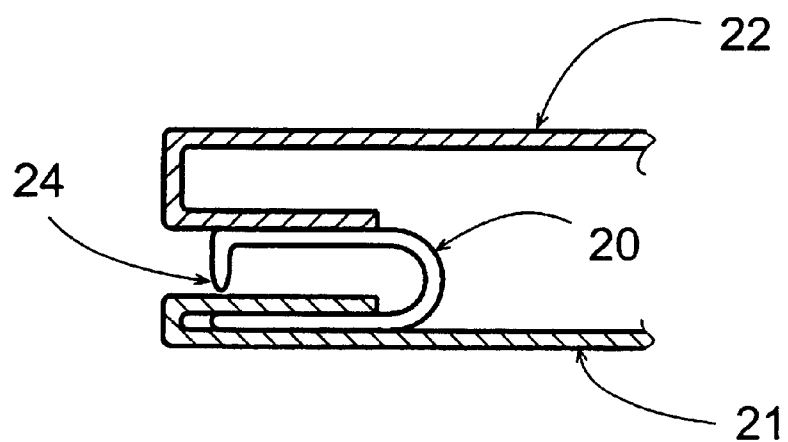

It is also possible to bend one end of said second flat part 24 at a specific angle, e.g. 90 degrees, towards the surface of the first part 21 of the device cabinet, whereupon a rigid, spring-like structure with a limited elastic distance is produced (FIGS. 4a and 4b).

The EMI gaskets 20, presented in the first embodiment according to the invention, are of rigid construction, whereupon they endure hard compression without being damaged enabling a good contact with joint surfaces. The structure, illustrated in FIGS. 4a and 4b, where one end of the flat part 24 has been bent, has a particularly rigid construction.

Figure 5A:
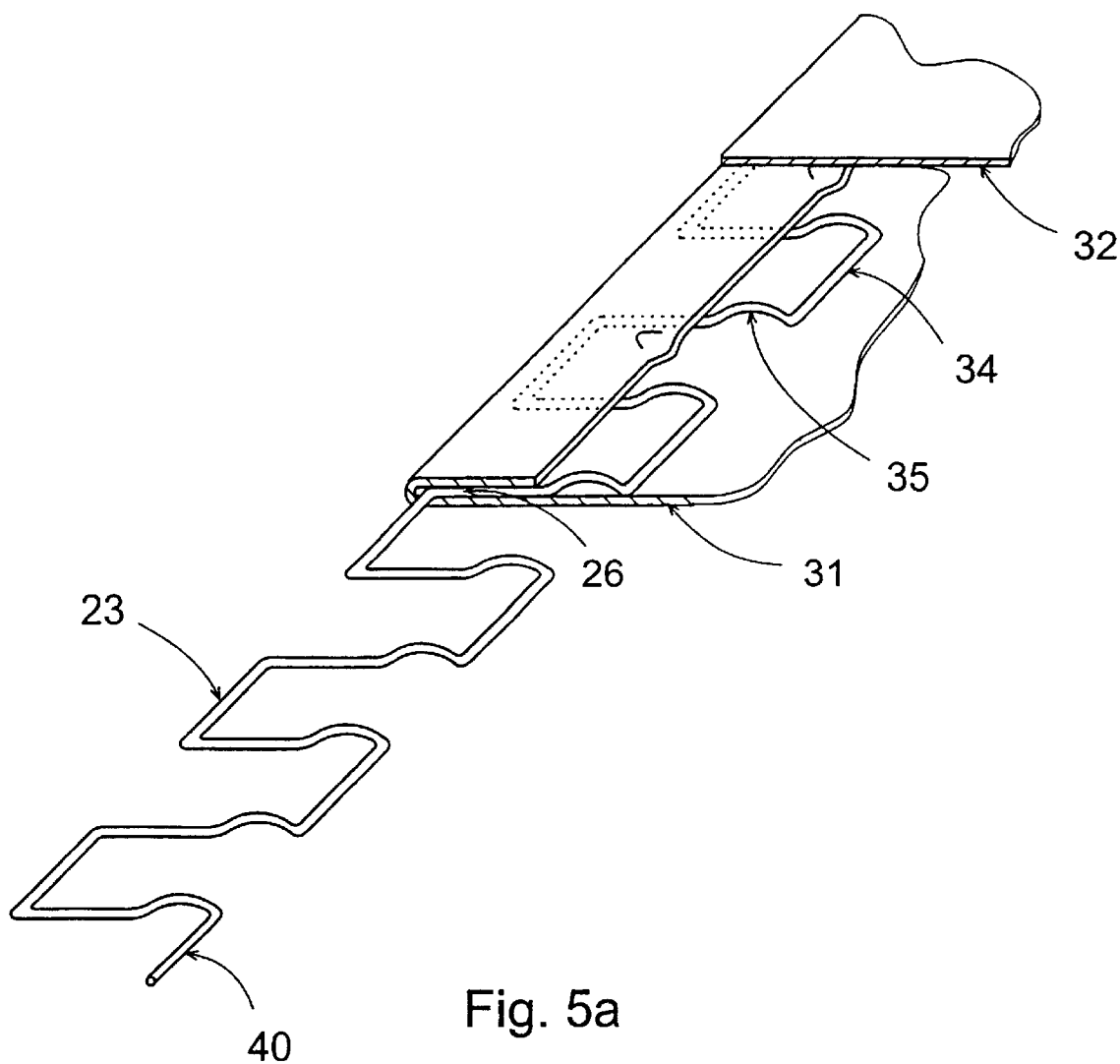
FIGS. 5a–5b show a second embodiment for EMI sealing a device cabinet according to the invention.
Figure 5B:
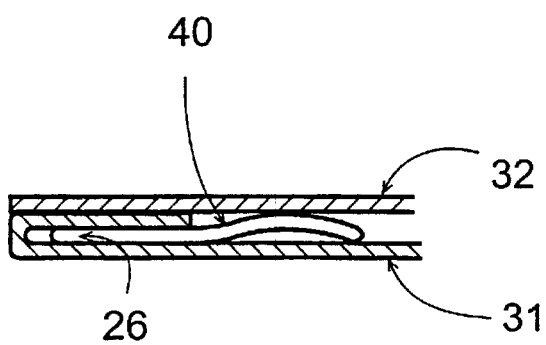

FIGS. 5a and 5b illustrate the second embodiment of the invention in which, e.g. a joint of a device cabinet made from sheet metal is EMI sealed and for which joint particularly little space is reserved in the cabinet. An EMI gasket 40 used for sealing comprises a flat part 23 along a specific length of the gasket, as was described in the first embodiment (first flat part 23), a straight portion 34 which is on the same plane as said flat part 23 and parallel to the longitudinal axis of the EMI gasket 40, as well as a curved portion 35 joining said parts that projects from said plane.

The component package to be sealed comprises a first part 31 and a second part 32, as well as a groove 26 for attaching the EMI gasket 40 by its flat part 23, as was described in the first embodiment.

The joint between the first and second parts 31, 32 of the device cabinet is produced by matching said parts together and by pressing the parts against each other (FIG. 5b). Differing from the first embodiment, in this embodiment, the first and second parts 31, 32 of the device cabinet at the joint between the first and second parts of the device cabinet are in direct contact with each other. However, without the EMI gasket 40, this kind of joint will probably leak, because it is difficult to manufacture plane-like joint surfaces in which the surfaces are tightly attached to each other in every place galvanically.

When pressing the parts 31, 32 of the device cabinet against each other, a compression is produced on the EMI gasket 40 attached in between them. The elastic forces that act in the gasket 40 tend to return the gasket into its original shape, whereupon the flexible gasket 40 is pressed, by its flat part 23 and its straight portion 34, tightly against the surface of the first part 31 of the cabinet and, by its curved portion 35, against the surface of the second part 32 of the cabinet. This being the case, firm electric contacts are formed through the EMI gasket between said first and second parts 31, 32, at short, regular distances along the whole length of the joint preventing electromagnetic radiation from penetrating the joint.

Figure 6:
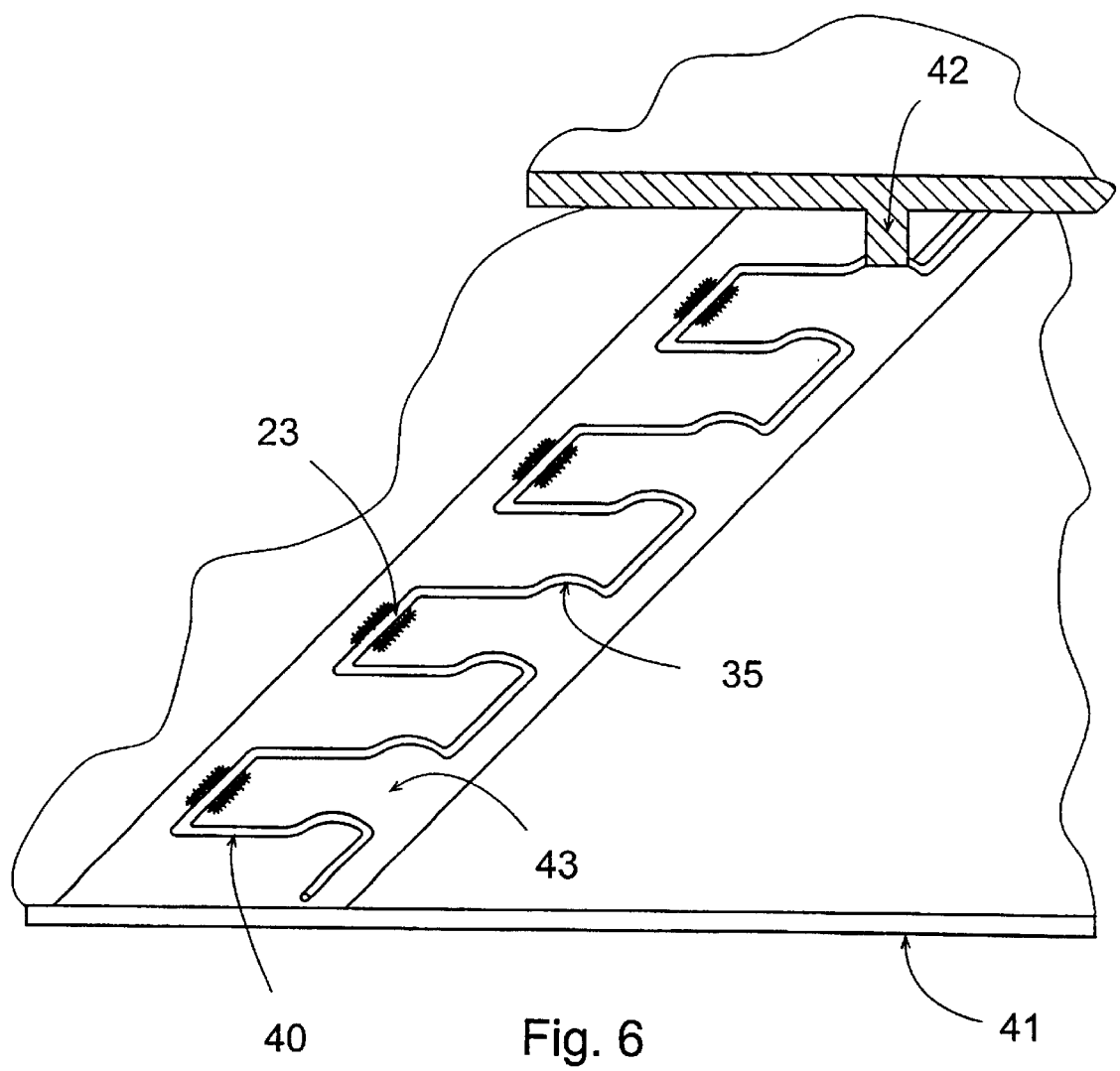
FIG. 6 shows an alternative implementation of the second embodiment according to the invention.

The EMI gasket 40 presented in the second embodiment can also be utilised, e.g. for sealing a joint between a partition 42 and a printed board 41 of a device cabinet made from die-casting aluminium alloy (FIG. 6). On the surface of the printed board 41 there is preferably located an electroconductive area 43, which can be made, e.g. from electroconductive metal film; foil. The EMI gasket 40 is attached by its flat part 23 to the electroconductive area 43 of the printed board 41, by soldering.

An EMI tight joint is produced between the partition 42 and the conductive area 43 of the printed board 41 by pressing the part of the device cabinet comprising the shouldered partition 42 into contact with the curved portion 35 of the EMI gasket 40, whereupon firm electric contacts are formed through the EMI gasket 40, soldered on the surface of the printed board 41, between the conductive area 43 of the printed board 41 and the partition 42 of the device cabinet, at short, regular distances along the whole length of the joint preventing electromagnetic radiation from penetrating the joint.

Figure 7A:
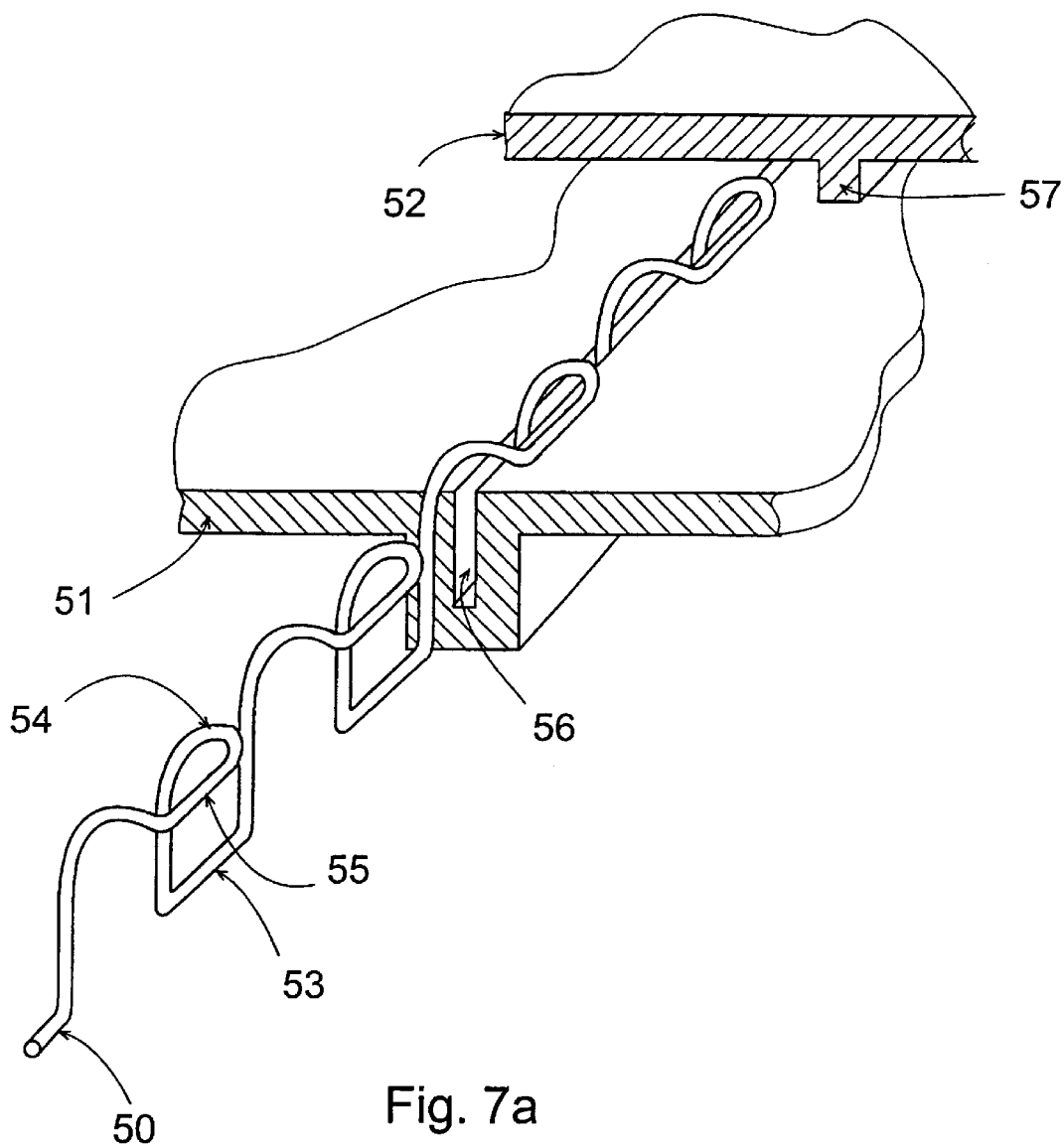
FIGS. 7a–7b show a third embodiment for EMI sealing a device cabinet according to the invention.
Figure 7B:
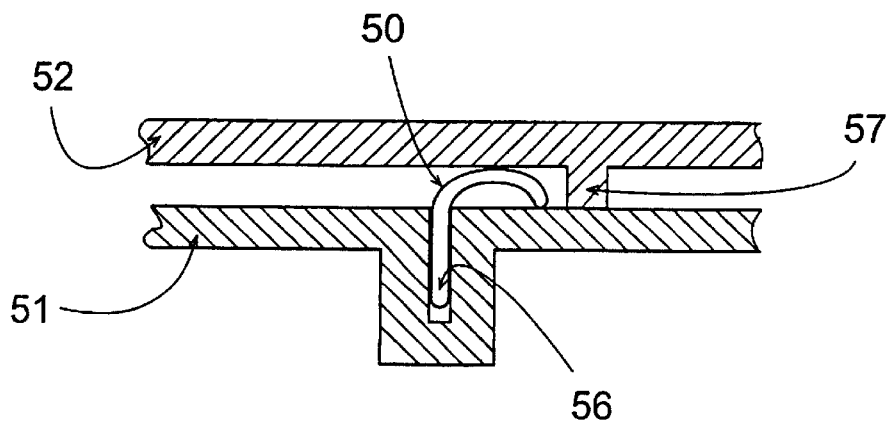

FIGS. 7a and 7b are related to the third embodiment according to the invention. In this embodiment a specific type of joint between two parts of a device cabinet is sealed EMI tight. An EMI gasket 50 used for sealing comprises a flat part 53 of specific length of the gasket and a straight portion 55, which is parallel to the longitudinal axis of the EMI gasket 50, as well as a curved portion 54 that joins said parts 53, 55. Typically, said straight portion 55 is not on the same plane as said flat part 53. Preferably, the cross direction profile of the EMI gasket 50 is in the shape of a J profile.

The device cabinet to be sealed (FIG. 7a) comprises a first part 51 and a second part 52. It can be made, e.g. from sheet metal or an aluminium alloy. Said first part 51 of the device cabinet comprises a groove 56 into which the EMI gasket 50 is pushed by its said flat part 53 for attaching the gasket, and the second part 52 of the device cabinet comprises a shouldered partition 57. The groove 56 is substantially perpendicular to the surface of said first part 51. The groove 56 can be made at the manufacturing stage of the cabinet, e.g. by edging sheet metal or from an aluminium alloy by die-casting. For example, a press-on fit can be used to assist in attaching the gasket 50 to the groove 56.

The joint between the first and second parts 51, 52 of the device cabinet is produced by matching said parts together and by pressing the parts against each other (FIG. 7b). When the parts 51, 52 of the device cabinet are pressed against each other, a compression is produced on the EMI gasket 50 attached between them. The height of the shouldered partition 57 limits the compression. The elastic forces that act in the compressed gasket 50 tend to return the gasket into its original shape, whereupon the flexible gasket 50 presses tightly against the surfaces of the first and second parts 51, 52 that are in contact with it. This being the case, firm electric contacts are formed between said first and second parts 51, 52, joined together through the EMI gasket 50, at short, regular distances along the whole length of the joint preventing electromagnetic radiation from penetrating the joint.

The structures presented in the second and third embodiments according to the invention are such that they enable quite a long elastic distance for the EMI gasket with respect to the dimensions of the joint. This cannot be achieved with a spring-like structure according to prior art without permanent deformations taking place in the gasket. Achieving a long elastic distance is important especially in long joints in order to get a reliable electric contact at short distances along the whole length of the joint, because changes in measurements occur very commonly on joint surfaces. Reasons for changes in measurements are, e.g. manufacturing tolerances or stresses directed to joint surfaces, which are caused by other device structures.

By shaping an EMI gasket according to the invention, it is possible to better adapt to the limitations set by the structure of a joint, e.g. space limitations. By suitably shaping an EMI gasket, it is possible to adjust, e.g. the elastic distance of the gasket. By shaping the wire, it is also possible to better select a suitable way of attaching the gasket and the contact point on the counter-surface.

This paper presents the implementation and embodiments of the invention with the help of examples. A person skilled in the art will appreciate that the present invention is not restricted to details of the embodiments presented above and that the invention can also be implemented in another form without deviating from the characteristics of the invention. The presented embodiments should be regarded as illustrative but not restricting. Thus, the possibilities of implementing and using the invention are only restricted by the enclosed claims, and the various options of implementing the invention as determined by the claims, including the equivalent implementations, also belong to the scope of the invention.

What is claimed is:

1. A device that comprises a first part and a second part and positioned between them an EMI (electromagnetic interference) gasket made from an electrically conductive wire bent into an elongated shape to form an elongated element, which EMI gasket comprises:

in a first plane, a bending portion which is repeated in the EMI gasket and which extends in said first plane in at least two non-parallel directions so that the bending, portion forms a first flat part in said first plane, the EMI gasket being configured for attachment by said bending portion to said first part of the device and to make electrical contact with said first part; and in a second plane different than the first plane, another portion which is repeated in the EMI gasket and which is configured to make electrical contact with the second part when said first and second parts of the device are joined, in order to provide electromagnetic interference shielding for said device, wherein the EMI gasket is attached to said first part of the device by solder.

2. The device of claim 1, wherein the EMI gasket is a piece periodically bent in an elongated shape, in which each period comprises said bending portion.

3. The device of claim 2, wherein said bending portion is repeated successively in line for a length of the EMI gasket to form said first flat part in said first plane.

4. The device of claim 2, wherein a vector parallel to a longitudinal axis of the EMI gasket substantially belongs to said first plane.

5. The device of claim 1, wherein the EMI gasket further comprises a curved portion that deviates from the first plane.

6. The device of claim 5, wherein the EMI gasket further comprises a straight portion parallel to a longitudinal length of the EMI gasket.

7. The device of claim 1, wherein the EMI gasket second portion forms a second flat part.

8. The device of claim 7, wherein said second flat part comprises a depression to limit elastic compression of the EMI gasket between the first and second parts of the device.

9. The device of claim 7, wherein an end of said second flat part is bent to limit elastic compression of the EMI gasket between the first and second parts of the device.

10. The device of claim 1, wherein said bending portion is mounted into an elongated groove of said first part of the device so as to make electrical contact with said first part, the elongated groove of said first part extending along a longitudinal length of the elongated EMI gasket.

11. The device of claim 10, wherein the first part of the device comprises a groove, and the EMI gasket is attached to said groove.

12. The device of claim 10, wherein the EMI gasket is attached to said groove with a press-on fit.

13. The device of claim 10, wherein a depression is arranged on edges of the groove to urge the EMI gasket to stay in the groove.

14. The device of claim 10, wherein the groove is planar in shape and a plane of said groove is substantially perpendicular to a surface of said first part of the device.

15. The device of claim 10, wherein the groove is planar in shape and a plane of said groove is substantially parallel to a surface of said first part of the device.

* * * * *